(12) United States Patent
Yamashita

(10) Patent No.: US 11,043,789 B2
(45) Date of Patent: Jun. 22, 2021

(54) LIGHT EMITTING DEVICE

(71) Applicant: NICHIA CORPORATION, Anan (JP)

(72) Inventor: Toshiaki Yamashita, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/834,828

(22) Filed: Mar. 30, 2020

(65) Prior Publication Data
US 2020/0343689 A1  Oct. 29, 2020

(30) Foreign Application Priority Data

Apr. 25, 2019 (JP) .............................. JP2019-084095

(51) Int. Cl.
*H01S 5/00* (2006.01)
*H01S 5/06* (2006.01)
(Continued)

(52) U.S. Cl.
CPC ............ *H01S 5/0087* (2021.01); *H01S 5/005* (2013.01); *H01S 5/02255* (2021.01); *H01S 5/02257* (2021.01); *H01S 5/0609* (2013.01); *H01S 5/3013* (2013.01); *H01S 5/32308* (2013.01); *H01S 5/4012* (2013.01); *H01S 5/4056* (2013.01); *H01S 5/4075* (2013.01); *H01S 5/023* (2021.01); *H01S 5/0222* (2013.01); *H01S 5/02315* (2021.01); *H01S 5/32341* (2013.01)

(58) Field of Classification Search
CPC ............ H01S 5/02257; H01S 5/02255; H01S 5/32341; H01S 5/0222; H01S 5/023; H01S 5/02315; H01S 5/4012; H01S 5/4056; H01S 5/4075; H01S 5/0087; H01S 5/005

See application file for complete search history.

(56) References Cited

U.S. PATENT DOCUMENTS 9,529,134 B2 * 12/2016 Morizumi ............. H01S 3/0092
10,908,347 B2 *  2/2021 Daikoku ............ G02F 1/133608
(Continued)

FOREIGN PATENT DOCUMENTS

JP        2013-254889 A    12/2013
JP        2014-086566 A     5/2014
(Continued)

*Primary Examiner* — Kinam Park
(74) *Attorney, Agent, or Firm* — Global IP Counselors, LLP

(57) ABSTRACT

A light emitting device includes a plurality of semiconductor laser elements, a light-transmissive member, and a wavelength conversion member. Each of the semiconductor laser elements is configured to emit light having a first wavelength. The light-transmissive member includes a plurality of first inclined surfaces and a lower surface. The light-transmissive member is positioned with respect to the semiconductor laser elements so that beams of the light emitted from the semiconductor laser elements enter the light-transmissive member respectively through the first inclined surfaces and exit from the lower surface. The wavelength conversion member is disposed in contact with the lower surface of the light-transmissive member and configured to convert at least a portion of the light exiting from the lower surface to wavelength-converted light having a second wavelength.

13 Claims, 5 Drawing Sheets

(51) Int. Cl.
    *H01S 5/30*     (2006.01)
    *H01S 5/323*     (2006.01)
    *H01S 5/02257*     (2021.01)
    *H01S 5/02255*     (2021.01)
    *H01S 5/40*     (2006.01)
    H01S 5/0222     (2021.01)
    H01S 5/023     (2021.01)
    H01S 5/02315     (2021.01)

(56) References Cited

U.S. PATENT DOCUMENTS

| | | | | |
|---|---|---|---|---|
| 2010/0295438 A1* | 11/2010 | Ott | ............................ | F21K 9/64 |
| | | | | 313/46 |
| 2013/0329397 A1* | 12/2013 | Shimizu | .................... | F21V 9/38 |
| | | | | 362/84 |
| 2017/0284634 A1* | 10/2017 | Kiyota | .................. | F21V 31/005 |
| 2018/0087726 A1* | 3/2018 | Yamashita | .............. | H01S 5/005 |
| 2020/0166687 A1* | 5/2020 | Welna | .................... | F21S 41/176 |

FOREIGN PATENT DOCUMENTS

| | | |
|---|---|---|
| JP | 2017-188651 A | 10/2017 |
| JP | 2018-037440 A | 3/2018 |
| JP | 2018-056160 A | 4/2018 |
| WO | 2009039827 A1 | 4/2009 |

\* cited by examiner

LIGHT EMITTING DEVICE

CROSS REFERENCE TO RELATED APPLICATIONS

This application claims priority to Japanese Patent Application No. 2019-084095 filed on Apr. 25, 2019. The entire disclosure of Japanese Patent Application No. 2019-084095 is hereby incorporated herein by reference.

BACKGROUND

1. Technical Field

The present disclosure relates to a light emitting device.

2. Description of Related Art

In a light emitting device that makes use of laser elements, the number of laser elements used, the type of wavelength conversion member, the type and layout of other components constituting the light emitting device, and the like are appropriately set according to the optical characteristics to be intended. For example, a light emitting device has been proposed in which a reflection member is disposed on the lower surface side of the wavelength conversion member, and the upper surface of the wavelength conversion member is the surface on which laser beam is incident and the surface on the light extraction side (For example, WO2009/039827).

With light emitting devices that make use of laser elements, there is a need to further reduce unevenness in the distribution of extracted light.

SUMMARY

It is an object of the present invention to provide a light emitting device with which light distribution unevenness can be reduced.

The present disclosure includes the following aspects.

A light emitting device includes a plurality of semiconductor laser elements, a light-transmissive member, and a wavelength conversion member. Each of the semiconductor laser elements is configured to emit light having a first wavelength. The light-transmissive member includes a plurality of first inclined surfaces and a lower surface. The light-transmissive member is positioned with respect to the semiconductor laser elements so that beams of the light emitted from the semiconductor laser elements enter the light-transmissive member respectively through the first inclined surfaces and exit from the lower surface. The wavelength conversion member is disposed in contact with the lower surface of the light-transmissive member and configured to convert at least a portion of the light exiting from the lower surface to wavelength-converted light having a second wavelength.

The above-mentioned light emitting device allows light distribution unevenness to be reduced.

DETAILED DESCRIPTION

Figure 1A:
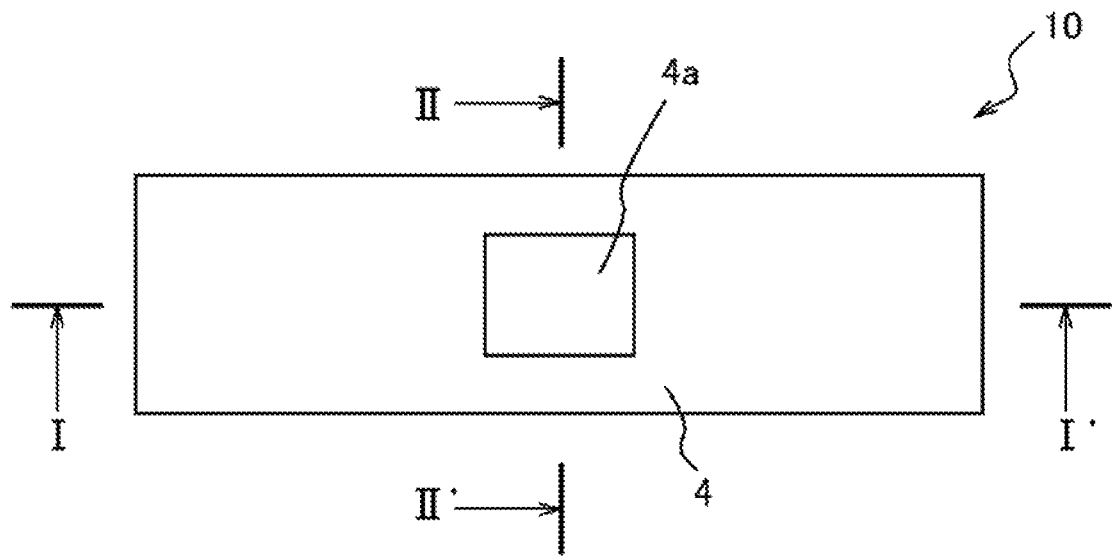
FIG. 1A is a top view of the light emitting device according to the first embodiment.

In the following, with reference to the drawings, a description will be given of an embodiment for carrying out the present disclosure. While the embodiment embodies the technical idea of the present disclosure, it is not intended to limit the present disclosure. The size or positional relationship of members in the drawings may be exaggerated for the sake of clarity. In the following description, identical names and reference characters are allotted to identical or similar members, and any repetitive description may be avoided as appropriate.

Light Emitting Device

As shown in FIGS. 1A to 1D, a light emitting device 10 disclosed herein includes, for example, a plurality of semiconductor laser elements 1 (hereinafter also referred to as "laser elements"), a light-transmissive member 2, and a wavelength conversion member 3. The light-transmissive member 2 has a plurality of first inclined surfaces 2a and a lower surface 2b. Each of beams of the light emitted from the laser elements 1 enters the light-transmissive member 2 through a corresponding one of the plurality of the first inclined surfaces 2a and exits from the lower surface 2b. The wavelength conversion member 3 is disposed in contact with the lower surface 2b of the light-transmissive member 2.

Figure 1B:
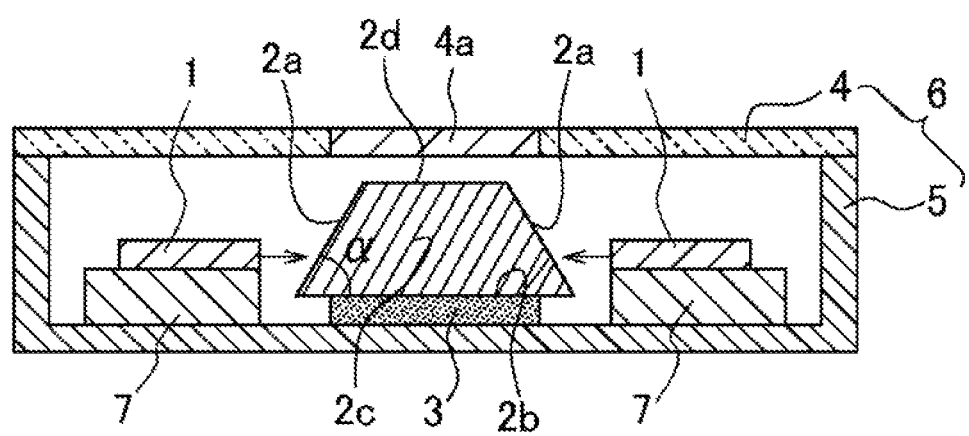
FIG. 1B is a cross-sectional view of the light emitting device taken along line I-I' in FIG. 1A.

Thus, using a plurality of the laser elements 1 makes it possible for light to be incident on the light-transmissive member 2 from different directions. As a result, light distribution unevenness of the extracted light (light exiting from the light emitting device 10) can be reduced. That is, as shown in FIG. 1B, in the case where the laser elements 1 are disposed so that their emitted light is obliquely incident on the light irradiation surface of the wavelength conversion member 3, a portion of the light emitted by the laser elements 1 is reflected by the light irradiation surface. Accordingly, in the case where there is only one laser element 1, the color of the light emitted by the laser element 1 becomes relatively stronger at the position where the light is reflected by the light irradiation surface of the wavelength conversion member 3. In view of this, a plurality of laser elements 1 are used and the laser beams are made to be incident from each of the plurality of first inclined surfaces 2a. Consequently, of the emitted light from the laser elements 1, the light reflected by the light irradiation surface of the wavelength conversion member 3 travels in a plurality of directions, so light distribution unevenness in the light extracted from the light emitting device 10 can be reduced. In this specification, "light distribution unevenness" means that the light distribution characteristics of light extracted from the light emitting device 10 are not consistent and are biased. This light distribution unevenness may instead be referred to as color unevenness or luminance unevenness.

Also, since the wavelength conversion member 3 is in contact with the lower surface 2b of the light-transmissive member 2, heat generated by the wavelength conversion member 3 from where it is irradiated with the light of the laser elements can be dumped to the light-transmissive member 2 side. The conversion efficiency of the wavelength conversion member 3 decreases at higher temperatures, but with the light emitting device 10 disclosed herein, because the heat of the wavelength conversion member 3 can be dumped to the light-transmissive member 2 side, the upper limit to the output of light that can be emitted without excessively lowering the conversion efficiency of the wavelength conversion member 3 can be raised. Consequently, laser elements that emit a relatively high-power laser beam can be employed as the laser elements 1, and the light emitting device 10 can have a higher optical output.

Semiconductor Laser Elements 1

A plurality of the semiconductor laser elements 1 are disposed in a single light emitting device 10.

The laser element 1 include an element having a semiconductor layer such as a nitride semiconductor (mainly represented by a formula $In_xAl_yGa_{1-x-y}N$, $0 \le x$, $0 \le y$, $x+y \le 1$). By adjusting the composition or the like, the emission wavelength of the semiconductor laser element 1 can be adjusted. For example, the semiconductor laser element 1 having an emission wavelength peak in a range from 400 nm to 530 nm can be used. In the case of combined with a YAG-based phosphor, the light extracted from the light emitting device 10 can be made white by mixing colors, and therefore, the laser element 1 in which the peak wavelength of the emitting laser beam is in the range from 420 nm to 490 nm is preferable. As described above, a laser element having a relatively high output can be used as the semiconductor laser element 1, and for example, a laser element having an optical output of 1 W or more, or even 5 W or more can be used.

The laser elements 1 are preferably disposed such that the end surfaces from which the laser beam is emitted are respectively facing the first inclined surfaces 2a of the light-transmissive member 2. It could also be said that the laser elements 1 are disposed so as to be opposite the light-transmissive member 2. This disposition allows the light emitted from the laser elements 1 to be efficiently guided to the light-transmissive member 2.

Figure 1C:
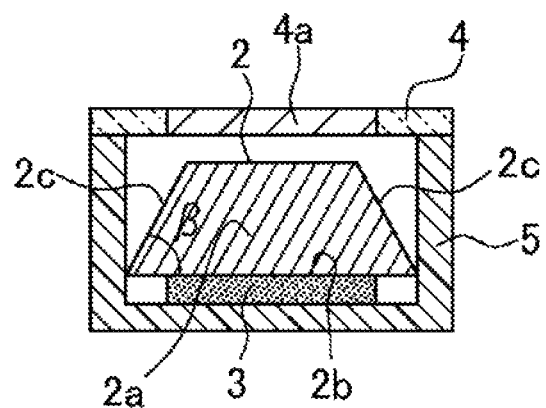
FIG. 1C is a cross-sectional view of the light emitting device taken along line II-II' in FIG. 1A.
Figure 1D:
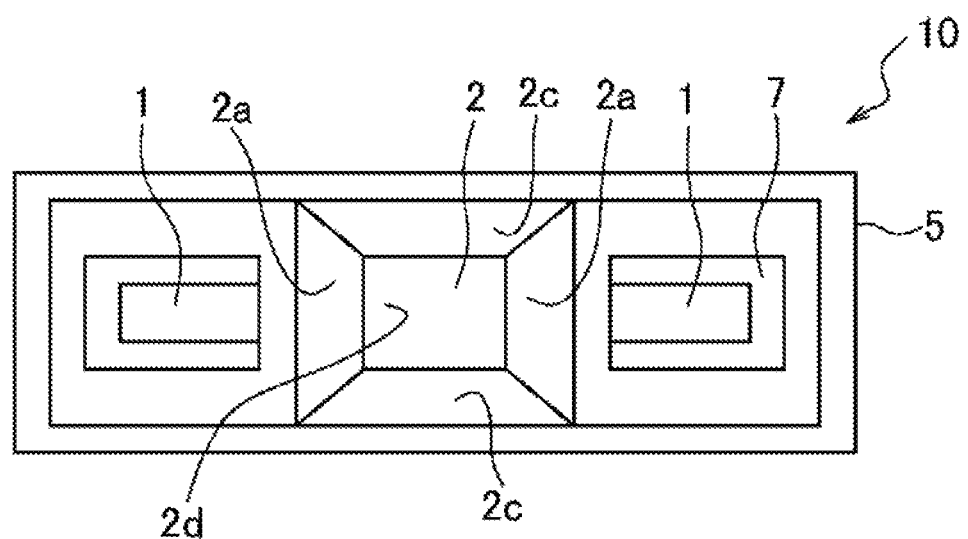
FIG. 1D is a top view of the light emitting device, in which a cap is omitted, according to the first embodiment.

It is also preferable for the laser elements 1 to be disposed at positions sandwiching the light-transmissive member 2 and/or the wavelength conversion member 3. This allows light distribution unevenness to be effectively reduced. That is, light distribution unevenness can be reduced by superimposing just the portion of low optical density of the spot of the light emitted from one laser element 1 and the portion of low optical density of the spot of the light emitted from another laser element 1, or by superimposing substantially the entire spots of the emitted light such that the portions of low and high optical density complement each other. For example, as shown in FIG. 1D, one laser element 1, the light-transmissive member 2, the wavelength conversion member 3, and one laser element 1 may be disposed linearly in that order in top view. In this disposition, two or more laser elements 1 may be disposed in each case. For instance, three laser elements 1 may be disposed apart from each other and centering on the light-transmissive member 2 and/or the wavelength conversion member 3 at positions of 120 degrees, that is, in three directions. Also, four laser elements 1 may be arranged apart from each other and centering on the light-transmissive member 2 and/or the wavelength conversion member 3 at positions of 90 degrees, that is, in four directions.

The laser elements 1 may be disposed directly on the mounting surface of a base 5 (discussed below), but are preferably disposed on the mounting surface of the base 5 via a submount 7. This allows the end surfaces of the laser elements 1 from which light is emitted to be separated from the mounting surface of the base 5, which prevents the main part of the laser beam emitted by the laser elements 1 from hitting the mounting surface of the base 5. Further, the submount 7 can be used to improve heat dissipation. The "mounting surface" of the base 5 refers to the surface on which components such as the laser elements 1 are mounted. For example, in FIG. 1B, the base 5 has a shape having a recess, and the bottom surface on the inside of the recess is the mounting surface. The submount 7 can be formed, for example, from aluminum nitride, silicon carbide, or the like. Whether mounted via the submount 7 or disposed directly on the mounting surface of the base 5, the laser elements 1 are preferably mounted so that the optical axis of the emitted laser beam is substantially parallel to the mounting surface of the base 5. The term "parallel" here means that variance of about ±5 degrees is permitted. Hereinafter, in this specification, "parallel" shall be used in the sense that a similar variance is permitted. Also, the term "optical axis" of the laser beam in this specification means the axis indicating the travel direction of the center of the laser beam. This same meaning is used for the optical axis of the emitted light.

Light-Transmissive Member 2

The light-transmissive member 2 has a plurality of first inclined surfaces 2a. Beams of the light emitted from the laser elements 1 are entered respectively on the first inclined surfaces 2a. The light-transmissive member 2 has a lower surface 2b on which the light that are entered on the first inclined surfaces 2a is extracted. The light-transmissive member 2 is disposed on the optical axis of the light emitted from the laser elements 1 so as to intersect the optical axis.

The light-transmissive member 2 is preferably a member that can transmit at least 60% of the light emitted from the semiconductor laser element 1 and the light converted by the wavelength conversion member 3, and may be a member that can transmit at least 70%, or a member that can transmit at least 80%, and more preferably is a member that can transmit at least 90%.

As shown in FIG. 1D, the first inclined surfaces 2a provided to the light transmissive member 2 are inclined toward the inside of the light-transmissive member 2. In other words, each of the first inclined surfaces 2a has an inclination angle α (see FIG. 1B) that is less than 90 degrees with respect to the lower surface 2b of the light-transmissive member 2. The first inclined surfaces 2a are surfaces that intersect the optical axes of the emitted light from the laser elements 1, that is, the optical axes of the light emitted by the laser elements 1, and are inclined with respect to the optical axes of the emitted light. The inclination angle of each of the first inclined surfaces 2a is preferably set to an angle at which, in conjunction with the refractive index of the material of the light-transmissive member 2 (discussed below), the emitted light from the laser elements 1 that was incident on the light-transmissive member 2 can be refracted under the light-transmissive member 2, that is, in a direction toward the lower surface 2b (discussed below). It is also preferable for the inclination angle of each of the first inclined surfaces 2a to be set to an angle at which light emitted from the plurality of laser elements 1 can be superimposed on the lower surface 2b of the light-transmissive member 2 (discussed below). The first inclined surfaces 2a are, for example, surfaces that intersect the optical axes of the laser beams emitted from the laser elements 1 at an angle of at least a few degrees but less than 90 degrees, and may be surfaces that intersect at an angle of at least a few tens of degrees but no more than 80 degrees, and may be surfaces that intersect at an angle of at least 40 degrees but no more than 75 degrees. The inclination angle α in FIG. 1B is the inclination angle of each of the first inclined surfaces 2a with respect to the lower surface 2b of the light-transmissive member, and in the case where the lower surface 2b of the light-transmissive member 2 is parallel to the optical axis of the laser beam emitted from one of the laser elements 1, the inclination angle α is equal to the angle formed between the corresponding one of the first inclined surfaces 2a and the optical axis of the laser beam. In other words, inclined surfaces having a specific inclination angle with respect to a plane including the optical axis of the light emitted from one of the laser elements 1 can be referred to as the first inclined surfaces 2a. The "specific inclination angle" is, for example, at least a few degrees but less than 90 degrees, and may be at least a few tens of degrees but no more than 80 degrees, and may be at least 40 degrees but no more than 75 degrees. More precisely, in the case where the direction of the optical axis of the light emitted from the laser elements 1 is defined as the x axis, the direction perpendicular thereto and parallel to the lower surface 2b of the light-transmissive member is defined as the y axis, and the direction perpendicular to the xy plane including the x axis and the y axis is defined as the z axis, a surface obtained by rotating the yz plane including the y axis and the z axis around the y axis as the rotational axis, that is, a surface inclined by the above-mentioned specific inclination angle with respect to the xy plane, can be referred to as a first inclined surface 2a. In other words, an inclined surface in which the dihedral angle between the inclined surface and the plane including the optical axis of the light emitted from one of the laser elements 1 is the above-mentioned specific inclination angle can be referred to as a first inclined surface 2a. Also, the first inclined surfaces 2a can be said to be surfaces that are inclined with respect to the lower surface 2b. Here, the inclination angle α can be set within the range of the above-mentioned specific inclination angle.

Figure 2A:
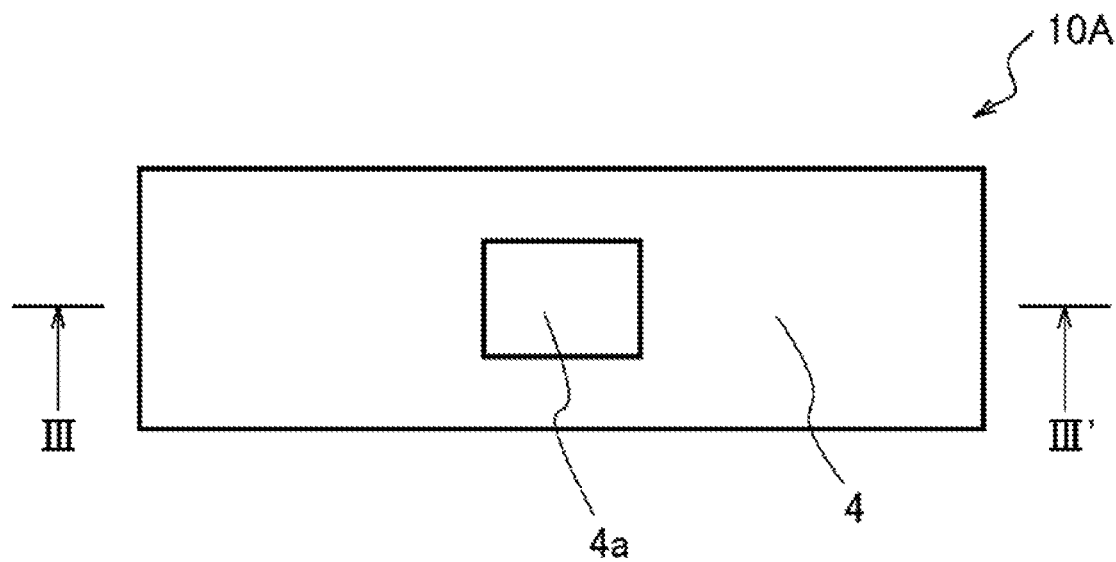
FIG. 2A is a top view of the light emitting device according to the second embodiment.
Figure 2B:
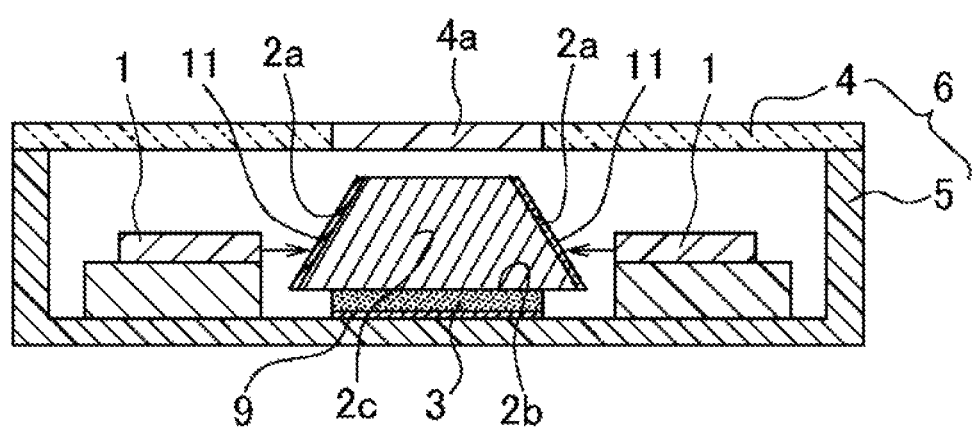
FIG. 2B is a cross-sectional view of the light emitting device taken along line III-III' in FIG. 2A.
Figure 2C:
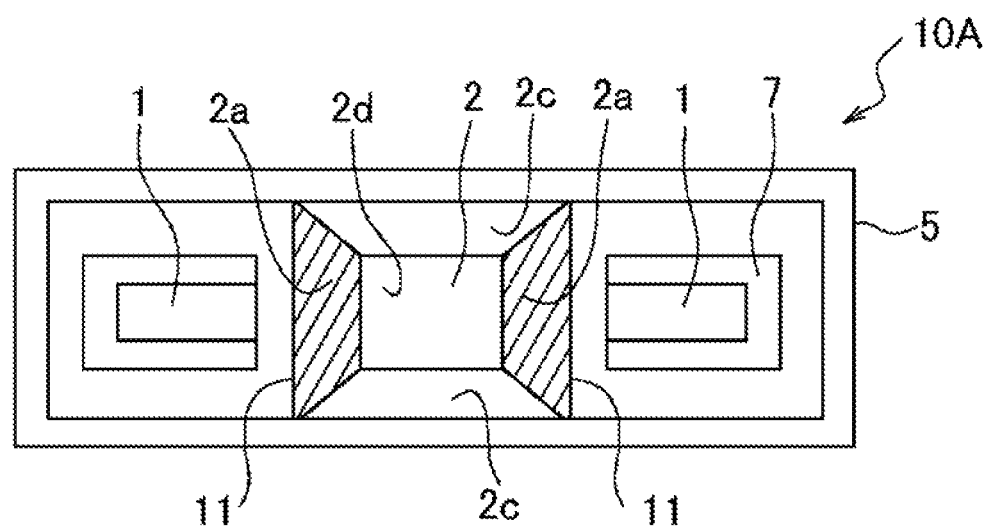
FIG. 2C is a top view of the light emitting device, in which a cap is omitted, according to the second embodiment.

As shown in FIGS. 2A to 2C, for example, the first inclined surfaces 2a are preferably respectively covered by band-pass filters 11 that transmit the light emitted from the laser elements 1 and reflect light converted by the wavelength conversion member 3 (discussed below). The first inclined surfaces 2a may be respectively covered by reflective films 9 or the like, which transmit the light emitted from the laser elements 1 and reflect light converted by the wavelength conversion member 3, instead of or in addition to the band-pass filters 11. The band-pass filter 11 preferably has a function of transmitting the light emitted from the laser elements 1 and reflecting the light converted by the wavelength conversion member 3. Covering the first inclined surfaces 2a with the band-pass filters 11 allows the light emitted from the laser elements 1 to be introduced into the light-transmissive member 2, and makes it possible for the part of the light converted by the wavelength converting member 3 that returns towards the laser element 1 to be reflected and guided to the light extraction surface (an upper surface 2d in FIGS. 2A to 2C) of the light-transmissive member. This allows the wavelength-converted light to be efficiently emitted from the light extraction surface of the light-transmissive member 2.

Examples of the band-pass filter 11 include a short wavelength pass filter (SWPF). The band-pass filter 11 is constituted by a dielectric multilayer film, for example.

Also, the lower surface 2b of the light-transmissive member 2 can be any surface as long as it can extract entered light. The lower surface 2b is also a surface from which the wavelength-converted light can be extracted toward a light extraction window 4a of a support member 6 of the light emitting device (discussed below) in order to extract light to the outside of the support member 6. In particular, the lower surface 2b is preferably disposed at a position where the beams of light that are emitted from the laser elements 1 and that irradiate the lower surface 2b can overlap. Therefore, the position and size of the lower surface 2b, its angle with respect to the first inclined surfaces 2a, and so on can be suitably set according to the light extraction direction, such as the position of the light extraction window 4a, the inclination angle of each of the first inclined surfaces 2a, the position of the laser elements 1, and so forth. For example, in the case where the support member 6 and the light extraction window 4a shown in FIG. 1B are provided, the lower surface 2b is preferably disposed parallel to the optical axis of the light emitted from the laser elements 1. The lower surface 2b preferably forms an inclination angle with the first inclined surfaces 2a of, for example, at least a few degrees but less than 90 degrees, more preferably at least a few tens of degrees but no more than 80 degrees, and even more preferably at least 40 degrees but no more than 75 degrees. Also, the lower surface 2b is preferably located under the first inclined surfaces 2a. The lower surface 2b can be located on the opposite side of the light-transmissive member 2 from the light extraction side. The lower surface 2b can be a surface facing the mounting surface of the base 5, from among the surfaces of the light-transmissive member 2. Furthermore, the lower surface 2b is adjacent to the first inclined surfaces 2a, for example.

It is also preferable for the light-transmissive member 2 to have second inclined surfaces 2c, which are distinct from the first inclined surfaces 2a and are adjacent to the lower surface 2b. The second inclined surfaces 2c are similar to the first inclined surfaces 2a in that they incline toward the inside of the light-transmissive member 2. In other words, the second inclined surfaces 2c have an inclination angle β (see FIG. 1C) that is less than 90 degrees with respect to the lower surface 2b of the light-transmissive member 2. So long as they are distinct from the first inclined surfaces 2a, the second inclined surfaces 2c here may have the same inclination angle as the first inclined surfaces 2a, but preferably they have a different inclination angle. The term "second inclined surface 2c" refers to a surface that is adjacent to the lower surface 2b and is inclined with respect to the lower surface 2b. As shown in FIG. 1C, in the case where the lower surface 2b of the light-transmissive member is parallel to the optical axis of the emitted laser beam, the inclination angle β of the second inclined surfaces 2c is the same as the inclination angle of the second inclined surfaces 2c with respect to a plane that is parallel to the lower surface 2b and includes the optical axis. The inclination angle β (see FIG. 1C) can be from at least several degrees to less than 90 degrees, may be from at least a few tens of degrees to not more than 80 degrees, and may be from at least 40 degrees to not more than 75 degrees. The second inclined surface 2c may be adjacent to one first inclined surface 2a, or may be adjacent to two first inclined surfaces 2a, that is, may be adjacent to the first inclined surfaces 2a on both sides. The second inclined surfaces 2c can each be a surface that is parallel to the optical axis of the light emitted from the laser element. For example, in the case where the x axis is the direction of the optical axis of light emitted from the laser elements 1, the y axis is a direction perpendicular thereto and parallel to the lower surface 2b of the light-transmissive member, and the z axis is a direction perpendicular to the xy plane including the x axis and the y axis, then the surface obtained by rotating the xz plane including the x axis and the z axis around the x axis (as the rotational axis), that is, a surface that is inclined with respect to the xy plane, can be called a second inclined surface 2c. The angle formed by the second inclined surfaces 2c and the xy plane can be in the same angle range as the above-mentioned inclination angle $\beta$.

Just one second inclined surface 2c may be disposed on the light-transmissive member 2, or a plurality of second inclined surfaces 2c may be disposed.

Figure 3A:
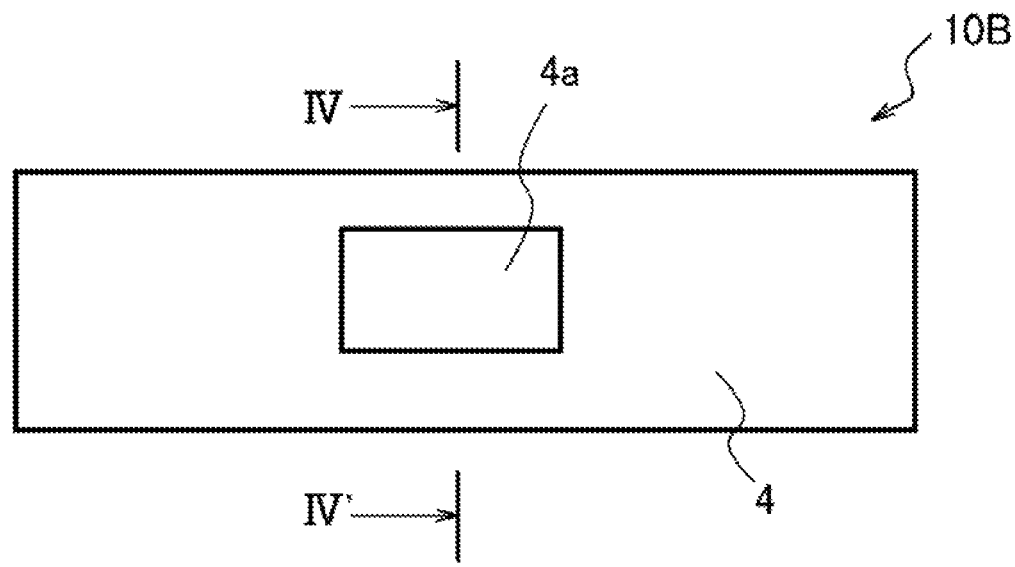
FIG. 3A is a top view of the light emitting device according to the third embodiment.
Figure 3B:
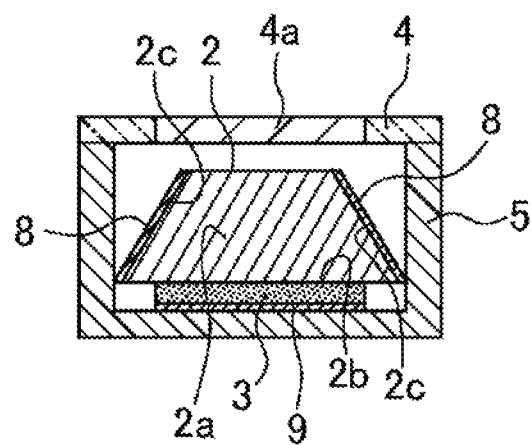
FIG. 3B is a cross-sectional view of the light emitting device taken along line IV-IV' in FIG. 3A.
Figure 3C:
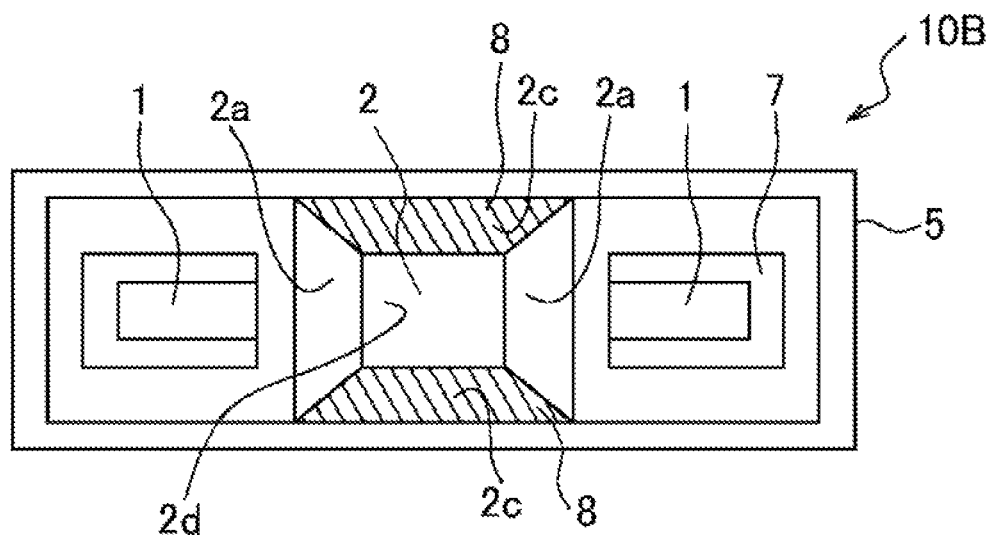
FIG. 3C is a top view of the light emitting device, in which a cap is omitted, according to the third embodiment.

The second inclined surfaces 2c are preferably respectively covered with light reflective films 8 (one example of first light reflective films), for example, as shown in FIGS. 3A to 3C. This allows the light that would otherwise escape to the outside from the second inclined surfaces 2c (out of all the light inside the light-transmissive member 2) to be reflected by the light reflective films 8, so that this light can eventually be extracted from the light extraction surface (for example, the upper surface 2d) of the member 2. That is, the light extraction efficiency of the light emitting device 10 can be improved. Also, it can be expected that unevenness in the light distribution of the light extracted from the light emitting device 10B can be reduced by repeating this reflection within the light-transmissive member 2 with the light reflective films 8 or the like.

Here, the light reflective film 8 preferably has a reflectance of at least 80%, and more preferably at least 90%, with respect to the light emitted from the laser elements 1 and the light converted by the wavelength conversion member 3. The light reflective film 8 can be formed from a dielectric multilayer film, a metal film, or a laminate of these. The light reflective film 8 can cover the second inclined surfaces 2c entirely.

The light-transmissive member 2 can have an upper surface 2d that extracts the light emitted from the laser elements 1 and/or the light converted by the wavelength conversion member 3. The upper surface 2d is, for example, a plane parallel to the lower surface 2b. The light emitting surface of the light-transmissive member 2 (such as the upper surface 2d) may be covered with an antireflection layer (AR layer). The light-transmissive member 2 may further have inclined surfaces other than the first inclined surfaces 2a and the second inclined surfaces 2c.

The light-transmissive member 2 can be a member having inclined surfaces, such as a quadrangular prism or a quadrangular pyramid. The light-transmissive member 2 can be formed from ceramics, glass (borosilicate glass, quartz glass, or the like), sapphire, a composite of these, or the like, for example. The light-transmissive member 2 may be formed using a metal oxide that does not correspond to these. The light-transmissive member 2 can be formed from a material having a refractive index allowing the laser beam incident on the light-transmissive member 2 to be refracted toward the lower surface 2b of the light-transmissive member 2, depending on the above-mentioned inclination angle of the first inclined surfaces 2a. The thickness of the light-transmissive member 2, which in FIG. 1B is the shortest distance from the lower surface 2b to the upper surface 2d, is, for example, at least 500 µm and no more than 3000 µm. For the heat generated by the wavelength conversion member 3 to be efficiently dissipated by the light-transmissive member 2, the material of the light-transmissive member 2 preferably has a relatively high thermal conductivity. Sapphire is an example of such a material having a relatively high thermal conductivity.

The first inclined surfaces 2a, the lower surface 2b, the second inclined surfaces 2c, and the upper surface 2d of the light-transmissive member 2 are preferably flat surfaces, but the surfaces may have recesses and protrusions. An example of the degree of unevenness here is for the average surface roughness Ra to be approximately from 1 nm to 200 nm.

Wavelength Conversion Member 3

The wavelength conversion member 3 is a member that converts the light emitted from the laser element 1 to light having a different wavelength. The wavelength conversion member 3 is in contact with the lower surface of the light-transmissive member 2. The term "contact" as used herein means that the wavelength conversion member 3 is preferably in direct contact with the light-transmissive member 2, but also encompasses a case where these are thermally connected, such as when the contact is via a member (for example, an adhesive or the like) used in order to fix or support the positional relationship between the two components. It is especially favorable for that the wavelength conversion member 3 and the light-transmissive member 2 to be in close contact with each other. The adhesive or the like may be anything that allows light to be incident from the light-transmissive member 2 on the wavelength conversion member 3. For example, a material that is light transmissive is preferable, and one capable of transmitting at least 70% of the light from the light-transmitting member 2 may be used, with one capable of transmitting at least 80% being preferable, and capable of transmitting at least 90% being even better. Thus, bringing the wavelength conversion member 3 into close contact with the lower surface of the light-transmissive member 2 allows the heat of the light-transmissive member 2 to be dissipated towards the wavelength conversion member 3. Also, as discussed below, in the case where the wavelength conversion member 3 is thermally connected to the support member 6, the heat of the wavelength conversion member 3 can also be dissipated towards the support member 6.

The wavelength conversion member 3 includes a phosphor. The wavelength conversion member 3 may be formed from a phosphor alone, or in addition to a phosphor, it may include a material that is light-transmissive to both the light from the semiconductor laser element 1 and the fluorescence from the phosphor. Examples of the wavelength conversion member 3 include phosphor single crystals, ceramics containing phosphors (hereinafter referred to as "phosphor ceramics"), and the like. It is preferable for the wavelength conversion member 3 to be constituted by just inorganic materials. The reason for this is that in the case where the wavelength conversion member 3 contains an organic material such as a resin, there is the risk of discoloration due to irradiation with the light emitted from the semiconductor laser elements 1, and of the adhesion of outgas to the semiconductor laser elements 1, etc. The wavelength conversion member 3 can be formed from a single material or from a plurality of materials, and can have a single-layer structure or a laminated structure. Providing the wavelength conversion member 3 allows the light emitted from the laser elements 1 to be subjected to wavelength conversion, and allows light that is a mixture of the light from the laser elements 1 and the wavelength-converted light can be released to the outside.

The phosphor can be selected in consideration of, for example, the wavelength of light emitted from the semiconductor laser element 1 to be used, the color of light to be obtained, and the like. Examples of the phosphor include YAG (yttrium-aluminum-garnet) phosphors that are activated by cerium, LAG (lutetium-aluminum-garnet) phosphors that are activated by cerium, CASN (nitrogen-containing aluminosilicate calcium) phosphors that are activated by europium and/or chromium and the forth. Among them, it is preferable to use a YAG phosphor excellent in heat resistance. A plurality of types of phosphors may be used in combination. For example, color rendering properties and color reproducibility can be adjusted by using phosphors having different emission colors in a combination or a mixing ratio suitable for a desired color tone. When a plurality of types of phosphors are used, a plurality of types of phosphors may be contained in the wavelength conversion member 3 having a single-layer structure, or different phosphors may be contained in different layers in the wavelength conversion member 3 having a laminated structure.

As a material to be combined with the phosphor as the phosphor ceramics, an inorganic material can be used. Examples of such inorganic materials include aluminum oxide ($Al_2O_3$), barium oxide (BaO), yttrium oxide ($Y_2O_3$), and the like. These may be used alone or in combination of two or more. Among them, phosphor ceramics containing aluminum oxide are preferable because they have good light-emitting property, melting point, thermal conductivity and thermal diffusivity. In the case that the wavelength conversion member 3 is formed of phosphor ceramics, the ratio of the phosphor can be 10% by, and may be 50% by weight or more, and 60% by weight or more, with respect to the total weight of the phosphor ceramics. The ratio of the phosphor to the total weight of the phosphor ceramics can be, for example, 95% by weight or less, or may be 80% by weight or less.

Also, using a material with excellent thermal conductivity as the material of the wavelength conversion member 3 makes it possible to efficiently dissipate the heat generated by the phosphor due to the irradiation of the laser elements 1 with the emitted light. This reduces the degree of decrease in the luminous efficiency of the phosphor, and allows a light output that is within the specified range to be maintained for an extended period.

The shape of the wavelength conversion member 3 can be appropriately set. In particular, examples of the shape of the wavelength conversion member 3 include a shape in which the upper surface is the above-mentioned surface that can be in close contact with the lower surface 2b of the light-transmissive member 2. The wavelength conversion member 3 is preferably a cube, a rectangular parallelepiped, a polygonal column or a polygonal frustum, and more preferably a cube or a rectangular parallelepiped. The wavelength conversion member 3 preferably has an upper surface serving as both a light incident surface and a light emission surface, and a lower surface that is parallel to this upper surface. This makes it possible to stably fix the wavelength conversion member 3 and the light-transmissive member 2 with respect to the support member 6.

The wavelength conversion member 3 may be of any size as long as the light from the laser elements 1 appropriately irradiates the upper surface thereof. The wavelength conversion member 3 is preferably large enough that all of the light emitted from the light-transmissive member 2 can be guided toward the upper surface of the wavelength conversion member 3. The wavelength conversion member 3 can be set to, for example, a columnar or frustum-shaped member having an upper surface whose surface area is the same as or smaller than that of the lower surface of the light-transmissive member 2. The light emitted from the laser elements 1 that is introduced into the wavelength conversion member 3 may sometimes be scattered and/or reflected after being incident on the light-transmissive member 2, and therefore be not a laser beam but light having a non-uniform phase, so the light introduced into the wavelength conversion member 3 is not limited to being a laser beam.

In the wavelength conversion member 3, the light incident surface and the light emitting surface are the same surface. Therefore, it is preferable for the wavelength conversion member 3 to include a reflective film 9 (one example of a second reflective film) as shown in FIGS. 2B and 3B, for example. That is, it is preferable for the wavelength conversion member 3 to include the reflective film 9 on the surface (for example, the lower surface) on the opposite side from the contact surface with the light-transmissive member 2 (for example, the upper surface). Providing this reflective film 9 allows the wavelength-converted light to be efficiently extracted to the light-transmissive member 2 side. The reflective film 9 need not be provided. In this case, it is preferable for the wavelength conversion member 3 to be placed on the mounting surface of the support member 6, and for the support member 6 to be made of a material having good reflectivity.

The reflective film 9 preferably has a reflectance of at least 80%, and more preferably at least 90%, with respect to the light that has undergone wavelength conversion by the wavelength conversion member 3. It is more preferable for the reflective film 9 to have the same degree of reflectance with respect to light emitted from the laser elements 1. The reflective film 9 can be formed by a dielectric multilayer film, a metal film, or a stacked film of these.

The surface of the wavelength conversion member 3 on which the reflective film 9 is disposed is preferably in close contact with the reflective film 9. This ensures a path for dissipating the heat generated in the wavelength conversion member 3 through the reflective film 9.

The reflective film 9 is disposed below the wavelength conversion member 3. The reflective film 9 may be disposed on a surface other than the surface of the wavelength conversion member 3 that comes into contact with the light-transmissive member 2. For instance, it may be disposed on a side surface of the wavelength conversion member 3. Providing the reflective film 9 reduces the emission of light from the wavelength conversion member 3 in a direction other than that of the light-transmissive member 2. This makes it possible to extract more of the light introduced into the wavelength conversion member 3 to the light-transmissive member 2, which contributes to higher light extraction efficiency.

A functional film such as an antireflection layer (AR layer), a short wavelength pass filter (SWPF), or a diffusion layer may be optionally formed on the light incident surface and/or the light emission surface of the wavelength conversion member 3. This functional film can be any of those known in this field.

Support Member 6

The light emitting device includes a support member 6. The laser elements 1, the light-transmissive member 2, and the wavelength conversion member 3 are disposed in the space defined by the support member 6. The support member 6 can hermetically seal the laser elements 1, the light-transmissive member 2, and the wavelength conversion member 3 and so on.

The support member 6 has a base 5 and a cap 4. As shown in FIGS. 1B and 2B, the laser elements 1, the light-transmissive member 2, and the wavelength conversion member 3 are disposed in the space defined by the base 5 and the cap 4. The base 5 is mainly for mounting the laser elements 1 and the wavelength conversion member 3. The base 5 can be made of a material having suitable strength and thermal conductivity. Examples of such materials include copper, copper alloys, iron, iron alloys such as KOVAR®, and other such metals, as well as aluminum nitride, aluminum oxide, and other such ceramics. The base 5 may be formed by combining a plurality of different materials.

The base 5 can have any of various shapes, such as a flat shape or a shape having a concave portion that opens upward. The base 5 may comprise a flat mounting surface on which the semiconductor laser elements 1 are mounted, and a lower surface that is parallel to this mounting surface. Examples of the planar shape of the base 5 include various shapes such as a substantially circular shape, a substantially elliptical shape, and a substantially polygonal shape. The size of the base 5 can be adjusted as necessary, and the surface area of the base 5 is 10 mm$^2$ or more, for example.

When strength, heat dissipation, and the like are taken into account, the thickness of the base 5 is at least 0.2 mm, and preferably at least 0.2 mm and no more than 1.0 mm. The base 5 may have a constant thickness over its entire region, or its thickness may vary from one place to the next.

In the case where the base 5 has a shape having a concave portion that opens upward, the height is, for example, at least 700 μm and no more than 4000 μm, and preferably at least 1000 μm and no more than 3500 μm.

The cap 4 is mainly used for hermetically sealing the laser elements 1 and the like along with the base 5. The cap 4 can be made from a material having suitable strength. Examples of such materials include copper, copper alloys, iron, iron alloys such as KOVAR®, and other such metals, and aluminum nitride, aluminum oxide, and other such ceramics. The cap 4 may be formed from the same material as the base 5, or may be formed from a different material. The cap 4 may also be formed by combining a plurality of materials.

The cap 4 is joined to the base 5 using a metal adhesive or by welding, for example.

The cap 4 can have any of various shapes, such as a flat shape or a shape having a recess that opens downward. The shape of the cap 4 is a shape that can define the space that accommodates the semiconductor laser elements 1 and the like by engagement with the base 5. For example, as shown in FIGS. 1A to 1D, in the case where the base 5 has a shape having a recess that opens upward, the cap 4 may have a flat shape. Alternatively, in the case where the base 5 has a flat shape comprising an upper surface and a lower surface that are parallel to each other, an example of the shape of the cap 4 is one having a ceiling portion located above the laser elements 1 and the like mounted on the base 5, and a recess that opens downward and has a side wall part that supports the ceiling portion. Also, the cap 4 may have a portion with a shape such as a protrusion, a bend, or the like for fixing the cap 4 on the base 5 and so forth.

The thickness of the cap 4 can be 0.2 mm or more, and for example can be 0.2 mm or more and 1.0 mm or less.

The cap 4 has a light extraction window 4*a* for extracting light. The light extraction window 4*a* is a light-transmissive portion of the cap 4. The light converted by the wavelength conversion member 3, etc., is extracted through the light extraction window 4*a* to the outside of the light emitting device 10. For example, the cap 4 can have a light-blocking member having a through-hole, and a light-transmissive lid that closes off the through-hole. In this case, the light-transmissive lid is the light extraction window 4*a*. The light extraction window 4*a* can be disposed at a position that is opposite the mounting surface of the base 5 on which the light-transmissive member 2 and the wavelength conversion member 3 are placed. In other words, the position of the light extraction window 4*a* can be disposed above the light-transmissive member 2 and the wavelength conversion member 3 placed on the base 5. The light extraction window 4*a* may be entirely separated from the outer periphery of the cap 4 as viewed from the upper surface of the cap 4. The light extraction window 4*a* is disposed, for example, in the center of the cap 4. The cap 4 may be made mainly of a light-transmissive material. In this case, a metal film may be provided to the portion to be joined to the base 5 to improve adhesion with the metal adhesive.

The size of the light extraction window 4*a* is set large enough that light emitted from the laser elements 1, reflected light, and/or wavelength-converted light can pass through. The size of the light extraction window 4*a* can be, for example, 0.3 mm$^2$ or more and 9 mm$^2$ or less, and may be 0.5 mm$^2$ or more and 4 mm$^2$ or less. The light extraction window 4*a* preferably is sized and positioned so as to completely surround the upper surface 2*d* of the light-transmissive member when viewed from the upper surface of the cap 4. This allows the main part of the light emitted from the upper surface 2*d* of the light-transmissive member to be extracted to the outside of the light emitting device 10. Examples of the shape of the light extraction window 4*a* include rectangular and other such polygonal shapes, circular, elliptical, and various other such shapes. Examples of a shape that combines the light-transmissive member 2 and the wavelength conversion member 3 include a shape obtained by combining a column shape and a frustum shape (such as a shape obtained by combining a quadratic prism and a truncated pyramid). In this case, the shape of the light extraction window 4*a* can be rectangular or another such polygonal shape, such as a quadrangular shape.

Embodiment 1

The light emitting device 10 of Embodiment 1 comprises two laser elements 1, the light-transmissive member 2, and the wavelength conversion member 3, as shown in FIGS. 1A to 1D.

The laser elements 1, the light-transmissive member 2, and the wavelength conversion member 3 are disposed inside the support member 6 having the base 5 and the cap 4. The base 5 is basically in a shape having a bottomed opening, and the cap 4 has a flat shape and defines the space that accommodates the laser elements 1 and the like when disposed opposite the base 5.

The semiconductor laser elements 1 are disposed on the mounting surface of the base 5 via the submount 7, within the space defined by the base 5 and the cap 4.

The base 5 and the cap 4 are each formed of KOVAR®. The light extraction window 4*a* for extracting light is provided in the center of the cap 4, and is provided, for example, in a rectangular shape measuring 1 mm×0.5 mm in top view. The base 5 and the cap 4 are welded together, which hermetically seals the semiconductor laser elements 1.

The light-transmissive member 2 and the wavelength conversion member 3 are further accommodated in the space defined by the support member 6.

The light-transmissive member 2 is disposed at a position where the light from the semiconductor laser elements 1 can be reflected toward the light extraction window 4a. The light-transmissive member 2 has a truncated quadrangular pyramid shape. This truncated quadrangular pyramid shape has two first inclined surfaces 2a inclined at an inclination angle α of 45 degrees on the inside of the light-transmissive member 2 and toward the laser elements 1, and has second inclined surfaces 2c that are different from the first inclined surfaces 2a. The second inclined surfaces 2c are adjacent to the first inclined surfaces 2a and the lower surface 2b of the light-transmissive member 2, and are inclined at an inclination angle β of 70 degrees with respect to the lower surface 2b. In other words, the first inclined surfaces 2a are at an angle of α=45 degrees with respect to the optical axis of the light emitted from the laser elements 1. The second inclined surfaces 2c are parallel to the optical axis. The light-transmissive member 2 is formed from sapphire, for example. In the light-transmissive member 2, the lower surface 2b, which is different from the surfaces on which light is incident (that is, the first inclined surfaces 2a), is a surface from which the light emitted from the semiconductor laser element 1 exits, and the upper surfaces 2d are the surfaces from which wavelength-conversion light is emitted.

The wavelength conversion member 3 is disposed below the light-transmissive member 2, in contact with the lower surface 2b of the light-transmissive member 2. The wavelength conversion member 3 has a cuboid shape, for example. The wavelength conversion member 3 is in close contact with the light-transmissive member 2 on its upper surface, and the wavelength conversion member 3 and the light-transmissive member 2 are integrated so that the wavelength of the light incident from the light-transmissive member 2 is converted, this wavelength-converted light is reflected to the light-transmissive member 2, and light can be extracted from the upper surface 2d of the light-transmissive member 2 toward the light extraction window 4a.

The wavelength conversion member 3 is formed by a sinter of a phosphor and aluminum oxide. A YAG phosphor is used as the phosphor, and the YAG phosphor is contained in an amount of 70 wt % with respect to the total weight of the wavelength conversion member 3.

With this configuration, while the light beams emitted from the two laser elements 1 are each incident on the light-transmissive member 2, and the portion where the light intensity of one laser element is weak and the portion where the light intensity of the other laser element is strong compensate each other, allowing unevenness in the light distribution of the extracted light to be reduced. Also, bringing the light-transmissive member 2 and the wavelength conversion member 3 into contact allows each to remove heat from the other. In particular, thermally connecting the wavelength conversion member 3 and the support member 6 allows the heat attributable to the emitted light of the semiconductor laser elements 1 to be effectively removed. As a result, relatively high-output light can be used as the emitted light from the semiconductor laser elements 1, and the light output of the light emitting device 10 can be improved.

Modification Example 1 of Embodiment 1

In a light emitting device 10A of this embodiment, a bandpass filter 11 is disposed on the first inclined surfaces 2a of the light-transmissive member 2, as shown in FIGS. 2A to 2C. The bandpass filter 11 is composed of, for example, a dielectric multilayer film in which a plurality of SiO$_2$ films and Nb$_2$O$_5$ films are stacked, and is a short-wavelength pass filter with which the reflectance of the light emitted from the laser elements 1 is lower than the reflectance at the wavelength of the wavelength-converted light was converted by the wavelength conversion member 3.

A dielectric multilayer film and a reflective film 9 made of silver are disposed on the lower surface of the wavelength conversion member 3.

Except for the above changes, the configuration is substantially the same as that of the light emitting device 10.

Because of this configuration, the wavelength-converted light that tries to exit from the light-transmissive member 2 to the semiconductor laser elements 1 side can be reflected by the band-pass filter 11.

Therefore, in addition to the same effect as the light emitting device 10, this light emitting device 10B also has an effect of further reducing the loss of light inside the light emitting device 10B.

Also, since the light converted by the wavelength conversion member 3 can be reflected by the reflective film 9 toward the light transmitting member 2, the light extraction efficiency can be further improved. Furthermore, the reflective film 9 ensures a heat dissipation path between the wavelength conversion member 3 and the support member 6, which allows for further heat dissipation.

Modification Example 2 of Embodiment 1

The light emitting device 10B of this embodiment has substantially the same configuration as the light emitting device 10A, except that a light transmitting member 2 having a dielectric multilayer film and a light reflective film 8 made of aluminum is used on the second inclined surfaces 2c as shown in FIGS. 3A to 3C.

With this configuration, any light that tries to exit from the inside of the light transmitting member 2 can be reflected by the light reflective film 8 on the second inclined surfaces 2c of the light transmitting member 2. This reduces the light distribution unevenness of the light extracted from the light emitting device 10B. Also, some of the light from the laser elements 1 is reflected toward the wavelength conversion member 3 by the light reflective film 8, and this increases the amount of excitation light that irradiates the wavelength conversion member 3 as compared with the case where the light reflective film 8 is not provided.

What is claimed is:
1. A light emitting device comprising:
   a plurality of semiconductor laser elements, each of the semiconductor laser elements being configured to emit light having a first wavelength;
   a light-transmissive member including a plurality of first inclined surfaces and a lower surface, and the light-transmissive member being positioned with respect to the semiconductor laser elements so that beams of the light emitted from the semiconductor laser elements enter the light-transmissive member respectively through the first inclined surfaces and exit from the lower surface; and
   a wavelength conversion member disposed in contact with the lower surface of the light-transmissive member and configured to convert at least a portion of the light exiting from the lower surface to wavelength-converted light having a second wavelength.

2. The light emitting device according to claim 1, wherein the light-transmissive member further includes at least one second inclined surface that is distinct from the first inclined surfaces and is adjacent to the lower surface, and the second inclined surface is covered by a first light reflective film.

3. The light emitting device according to claim 1, further comprising a second reflective film disposed below the wavelength conversion member so that the wavelength-converted light is reflected by the second reflective film and enters the light-transmissive member through the lower surface of the light-transmissive member, wherein the light-transmissive member further includes an upper surface through which the wavelength-converted light exits.

4. The light emitting device according to claim 1, wherein the light-transmissive member and the wavelength conversion member are disposed at positions sandwiched by 2 or more of the semiconductor laser elements.

5. The light emitting device according to claim 1, wherein the first inclined surfaces are respectively covered by band-pass filters configured to transmit the beams of the light emitted from the semiconductor laser elements and reflect the wavelength-converted light.

6. The light emitting device according to claim 1, further comprising a support member having a base and a cap, the cap having a light extraction window, and the semiconductor laser elements, the light-transmissive member and the wavelength conversion member are disposed within a space defined by the base and the cap.

7. The light emitting device according to claim 6, wherein the support member hermetically seals the semiconductor laser elements.

8. The light emitting device according to claim 1, wherein each of the semiconductor laser elements has an emission wavelength peak in a range from 400 nm to 530 nm.

9. The light emitting device according to claim 1, wherein each of the semiconductor laser elements includes a nitride semiconductor layer.

10. The light emitting device according to claim 1, wherein the light-transmissive member has a shape of a quadrangular prism or a quadrangular pyramid.

11. The light emitting device according to claim 1, wherein the light-transmissive member is formed from ceramics, glass, sapphire, or a composite of two or more of ceramics, glass, and sapphire.

12. The light emitting device according to claim 1, wherein the wavelength conversion member includes a phosphor.

13. The light emitting device according to claim 1, wherein the wavelength conversion member is formed from phosphor single crystals or ceramics containing phosphors.

\* \* \* \* \*